United States Patent [19]

Krol

[11] Patent Number: 4,633,472
[45] Date of Patent: Dec. 30, 1986

[54] MULTIPROCESSOR COMPUTER SYSTEM COMPRISING N PARALLEL OPERATING COMPUTER MODULES, AND COMPUTER MODULE FOR USE IN SUCH A MULTIPROCESSOR COMPUTER SYSTEM

[75] Inventor: Thijs Krol, Eindhoven, Netherlands

[73] Assignee: U.S. Philips Corporation, New York, N.Y.

[21] Appl. No.: 542,839

[22] Filed: Oct. 17, 1983

[30] Foreign Application Priority Data

Oct. 20, 1982 [NL] Netherlands .......................... 8204038

[51] Int. Cl.⁴ ...................... G06F 11/16; H03M 13/00
[52] U.S. Cl. ........................................ 371/40; 364/200
[58] Field of Search ... 364/200 MS File, 900 MS File; 371/2, 68, 43, 37, 40

[56] References Cited

U.S. PATENT DOCUMENTS

| 4,395,768 | 7/1983 | Goethals | 371/45 |
| 4,402,045 | 8/1983 | Krol | 364/200 |
| 4,438,494 | 3/1984 | Budde | 364/200 |
| 4,512,020 | 4/1985 | Krol | 371/37 |

Primary Examiner—James D. Thomas
Assistant Examiner—Florin Munteanu
Attorney, Agent, or Firm—Jack E. Haken; James J. Cannon, Jr.

[57] ABSTRACT

A multiprocessor computer system having n parallel-operating computer modules which each include a processor module, a memory module and a data word reconstruction module, wherein each module of said system processes the same piece of data simultaneously and in parallel. The data words are applied to a reducing encoder so that code symbols stored in the relevant computer modules form a code word. The relevant error-correction code has a simultaneous correction capability in at least two code symbols. Each data word reconstruction module receives the entire code word in order to reconstruct the data word therefrom. Each computer module also has an input/output memory module. This module receives a coded data word which is decoded when it is presented again. Decoding is performed so that each bit in the input/output memory is mapped on at the most one bit of the associated memory module.

6 Claims, 6 Drawing Figures $$[G] = \begin{pmatrix} a^0 & \phi \\ \phi & a^0 \\ a^7 & a^{11} \\ a^{11} & a^7 \end{pmatrix}$$

FIG.2

$[G_3] = [a^0 \phi] \; ; \; [G_3^*] = \begin{bmatrix} a^0 & \phi \\ \phi & a^0 \end{bmatrix} \; , \; [G_3^*]^{-1} = \begin{bmatrix} a^0 & \phi \\ \phi & a^0 \end{bmatrix}$ $[G_2] = [\phi \; a^0] \; ; \; [G_2^*] = \begin{bmatrix} \phi & a^0 \\ a^0 & \phi \end{bmatrix} \; , \; [G_2^*]^{-1} = \begin{bmatrix} \phi & a^0 \\ a^0 & \phi \end{bmatrix}$ $[G_1] = [a^7 \; a^{11}] \; ; \; [G_1^*] = \begin{bmatrix} a^7 & a^{11} \\ a^0 & \phi \end{bmatrix} \; , \; [G_1^*]^{-1} = \begin{bmatrix} \phi & a^0 \\ a^4 & a^{11} \end{bmatrix}$ $[G_0] = [a^{11} \; a^7] \; ; \; [G_0^*] = \begin{bmatrix} a^{11} & a^7 \\ a^0 & \phi \end{bmatrix} \; , \; [G_0^*]^{-1} = \begin{bmatrix} \phi & a^0 \\ a^8 & a^4 \end{bmatrix}$

FIG.3

$[G_3] = [a^0 \phi] \; ; \; [G_3^*] = \begin{bmatrix} \phi & a^0 \\ a^0 & a^0 \end{bmatrix} \; , \; [G_3^*]^{-1} = \begin{bmatrix} a^0 & a^0 \\ a^0 & \phi \end{bmatrix}$ $[G_2] = [\phi \; a^0] \; ; \; [G_2^*] = \begin{bmatrix} a^0 & \phi \\ a^0 & a^0 \end{bmatrix} \; , \; [G_2^*]^{-1} = \begin{bmatrix} a^0 & \phi \\ a^0 & a^0 \end{bmatrix}$ $[G_1] = [a^7 \; a^{11}] \; ; \; [G_1^*] = \begin{bmatrix} a^0 & \phi \\ a^9 & a^{11} \end{bmatrix} \; , \; [G_1^*]^{-1} = \begin{bmatrix} a^0 & \phi \\ a^{13} & a^4 \end{bmatrix}$ $[G_0] = [a^{11} \; a^7] \; ; \; [G_0^*] = \begin{bmatrix} a^0 & \phi \\ a^{12} & a^7 \end{bmatrix} \; , \; [G_0^*]^{-1} = \begin{bmatrix} a^0 & \phi \\ a^5 & a^8 \end{bmatrix}$

FIG.4

$$[F] = \begin{bmatrix} 1 & 0 & 0 & 0 & 1 & 1 & 1 & 1 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \end{bmatrix}$$

$$[G_3^I] = \begin{bmatrix} 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \end{bmatrix} \qquad [F^I] = \begin{bmatrix} 1 & 0 & 0 & 0 & 1 & 1 & 1 & 1 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \end{bmatrix}$$

$$[G_2^I] = \begin{bmatrix} 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \\ 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \end{bmatrix} \qquad [G_2^*] = \begin{bmatrix} 1 & 1 & 1 & 1 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \\ 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \end{bmatrix}$$

$$[G_2^{*-1}] = [G_2^I] \cdot [F^I] = \begin{bmatrix} 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \\ 1 & 0 & 0 & 0 & 1 & 1 & 1 & 1 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \end{bmatrix}$$

FIG. 5

$$[G_1^{*-1}] = \begin{bmatrix} 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \\ 1 & 1 & 0 & 0 & 1 & 1 & 1 & 1 \\ 0 & 1 & 1 & 0 & 0 & 1 & 1 & 1 \\ 1 & 0 & 1 & 1 & 0 & 0 & 1 & 1 \\ 1 & 0 & 0 & 1 & 1 & 1 & 1 & 0 \end{bmatrix} \cdot \begin{bmatrix} 1 & 0 & 0 & 0 & 1 & 1 & 1 & 1 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \end{bmatrix} = \begin{bmatrix} 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \\ 1 & 1 & 0 & 0 & 1 & 1 & 1 & 1 \\ 0 & 1 & 1 & 0 & 0 & 1 & 1 & 1 \\ 1 & 0 & 1 & 1 & 0 & 0 & 1 & 1 \\ 1 & 0 & 0 & 1 & 1 & 1 & 1 & 0 \end{bmatrix}$$

$$[G_1^*] = \begin{bmatrix} 1 & 0 & 0 & 0 & 1 & 1 & 1 & 1 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \end{bmatrix} \cdot \begin{bmatrix} 0 & 1 & 0 & 1 & 1 & 1 & 1 & 1 \\ 1 & 0 & 1 & 0 & 0 & 1 & 1 & 1 \\ 1 & 1 & 0 & 1 & 0 & 0 & 1 & 1 \\ 1 & 0 & 1 & 1 & 1 & 1 & 1 & 0 \\ 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \end{bmatrix} = \begin{bmatrix} 1 & 0 & 1 & 0 & 1 & 1 & 1 & 1 \\ 0 & 1 & 0 & 1 & 0 & 1 & 1 & 1 \\ 0 & 0 & 1 & 0 & 0 & 0 & 1 & 1 \\ 0 & 1 & 0 & 0 & 1 & 1 & 1 & 0 \\ 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \end{bmatrix}$$

$$G_0^{*-1} = \begin{bmatrix} 0 & 0 & 0 & 0 & 1 & & & \\ & & & & & 1 & & \\ & & & & & & 1 & \\ & & & & & & & 1 \\ 1 & 0 & 1 & 0 & 1 & 1 & 0 & 0 \\ 1 & 1 & 0 & 1 & 0 & 1 & 1 & 0 \\ 1 & 1 & 1 & 0 & 1 & 0 & 1 & 1 \\ 0 & 1 & 0 & 1 & 1 & 0 & 0 & 1 \end{bmatrix} \cdot \begin{bmatrix} 1 & & & & 1 & 1 & 1 & 1 \\ & 1 & & & & & & \\ & & 1 & & & & & \\ & & & 1 & & & & \\ & & & & 1 & & & \\ & & & & & 1 & & \\ & & & & & & 1 & \\ & & & & & & & 1 \end{bmatrix} = \begin{bmatrix} 0 & 0 & 0 & 0 & 1 & & & \\ & & & & & 1 & & \\ & & & & & & 1 & \\ & & & & & & & 1 \\ 1 & 0 & 1 & 0 & 0 & 0 & 1 & 1 \\ 1 & 1 & 0 & 1 & 1 & 0 & 0 & 1 \\ 1 & 1 & 1 & 0 & 0 & 1 & 0 & 0 \\ 0 & 1 & 0 & 1 & 1 & 0 & 0 & 1 \end{bmatrix}$$

$$G_0^* = \begin{bmatrix} 1 & & & & 1 & 1 & 1 & 1 \\ & 1 & & & & & & \\ & & 1 & & & & & \\ & & & 1 & & & & \\ & & & & 1 & & & \\ & & & & & 1 & & \\ & & & & & & 1 & \\ & & & & & & & 1 \end{bmatrix} \cdot \begin{bmatrix} 1 & 1 & 1 & 1 & 0 & 1 & 0 & 1 \\ 0 & 1 & 1 & 1 & 1 & 0 & 1 & 0 \\ 0 & 0 & 1 & 1 & 1 & 1 & 0 & 1 \\ 1 & 1 & 1 & 0 & 1 & 0 & 1 & 1 \\ 1 & & & & & & & \\ & 1 & & & & & & \\ & & 1 & & & & & \\ & & & 1 & & & & \end{bmatrix} = \begin{bmatrix} 0 & 0 & 0 & 0 & 0 & 1 & 0 & 1 \\ 1 & 0 & 0 & 0 & 1 & 0 & 1 & 0 \\ 1 & 1 & 0 & 0 & 1 & 1 & 0 & 1 \\ 0 & 0 & 0 & 1 & 1 & 0 & 1 & 1 \\ 1 & & & & & & & \\ & 1 & & & & & & \\ & & 1 & & & & & \\ & & & 1 & & & & \end{bmatrix}$$

FIG.6

MULTIPROCESSOR COMPUTER SYSTEM COMPRISING N PARALLEL OPERATING COMPUTER MODULES, AND COMPUTER MODULE FOR USE IN SUCH A MULTIPROCESSOR COMPUTER SYSTEM

BACKGROUND OF THE INVENTION

1. Field of the Invention

The invention relates to a multiprocessor computer system, comprising n synchronously controlled parallel-operating computer modules, each of which is localized in its own fault isolation area, Each computer module comprises a processor module; a data channel connected to a data connection of the processor module; a reducing encoder connected to the data channel in order to form a code symbol from a data word received so that the relevant encoders forms, on the basis of a data word comprising k data symbols, a code word consisting of $k+1 \leq n < 3k$ code symbols of a code incorporating a simultaneous correction capability in at least two code symbols; a memory module comprising a first data input which is connected to a first data output of the associated reducing encoder, and to a second data output; and a data word reconstruction module which is connected via an interconnection network, to the relevant second data outputs of the memory modules of the various computer modules in order to receive a relevant code symbol of a code word from each computer module in order to reconstruct a data word therefrom, the data word reconstruction module comprising a third data output which is connected to said data connection and to said data channel, said data channel also comprising a second data connection for external data input/output.

2. Description of the Prior Art

Such a computer system is disclosed in the previous U.S. Pat. No. 4,512,020 issued Apr. 16, 1985, assigned to the assignee of the present application. For such a multiprocessor computer system a comparatively small total memory capacity suffices for a comparatively high processor capacity, for example in comparison with a total triplication of processor and memory capacity distributed between a corresponding number of faults isolation areas. In accordance with the previous Patent Application, similarly to when using the total triplication, the total circuit of one such fault isolation area may exhibit an arbitrary data error without the operation of the multiprocessor computer system as a whole being impeded. The computer system in accordance with the previous Patent Application has several modes of operation. In one of these modes an arbitrary symbol error can be corrected (provided that it is known which symbol is incorrect) plus one single bit error. In another mode, two arbitrary one-bit errors can be corrected. Several codes which are capable of correcting several bit errors are known per se, for example, the "Fire" codes; the error location while using the last-mentioned codes may be completely arbitrary.

The error correction capability according to said Patent Application is an extension of that disclosed in the previous U.S. Pat. No. 4,402,045 assigned to the assignee of the present application. The latter offers several redundancy levels which can be used to implement the data input/output. A high degree of redundancy with ample correction of errors is achieved by multiplying the connections for data input/output in the same way as the multiplication of the computer modules in the computer system itself. The relevant peripheral apparatus may then be of a multiple construction. On the other hand, the peripheral apparatus may also be singular without redundancy. Intermediate redundancy levels can also be implemented. These different redundancy levels can also be incorporated in the multiprocessor computer system disclosed in said U.S. Patent Application Ser. No. 416,992. In many cases it is necessary to implement an input/output memory, for example for buffering and reformatting the data. The memory capacity is then usually comparatively small when considered as cost factor in comparison with the other cost factors which would occur if a code word comprising n symbols with associated data reconstruction sectors, data interconnections and the like were to be formed. This is also applicable if, in addition to the input/output memory, an input/output processor module and possibly further components associated therewith are required.

Consequently, the input/output data is received in non-coded form (as viewed in relation to the error correction code); therefore, it is an object of the invention to ensure that the input/output data may not be processed in such a way during the input/output process that a bit error occurring could be converted in the reducing encoder into a multibit symbol error. Such a multibit symbol error might be correctable in many cases, but should another bit error occur in the same code word, the error correction capability of the code might easily be insufficient. The object in accordance with the invention is achieved in that each computer module also comprises a second data channel which is connected in series with said second data connection and which comprises a third data connection to the environment; an input/output memory module which is connected, at least when the generator matrix $(G_i)$ of the associated reducing encoder maps a data bit on more than one code bit, to the second data channel by way of a second, non-reducing encoder and a third data input and a decoder which is associated with the second encoder, the following relations existing between the generator matrix $(G_i)$ of a reducing encoder, at least in as far as this encoder maps a data bit on more than one code bit, the generator matrix $[G_i]$ of the second encoder, and the generator matrix $[G_i^{*-1}]$ of the decoder:

$$[G]\cdot[G_i^{*-1}]=[I],\text{ the identity matrix;}$$

$$[F]=[G_i]\cdot[G_1^{*-1}],$$

in which each column of [F], written as consisting of bits, contains at the most one "1" and for the remainder exclusively "zeros", each row of [F] containing at least one "1", so that in the relevant computer module a bit of a data word encoded in the input/output memory is mapped on at the most one bit of the code symbol which can be formed from the data word. In as far as a reducing encoder maps a data bit on "zero" code bits, an error in the relevant data bits will not be passed on to the relevant memory module. In as far as the mapping is performed on one code bit in the reducing encoder, a bit error in the input/output memory will be passed on as only a single bit error in the relevant memory module, even when no special steps are taken in the second encoder/decoder. In both cases the generator matrix of the second encoder may have the properties of an identity matrix (multipled or not by a transposition matrix which modifies the sequence of the bits) for the relevant data bit. In as far as the reducing encoder maps a data bit on more than one code bit, the relevant generator matrices must satisfy more severe requirements.

Preferably, the error correction capability of the code allows for at least one arbitrary error vector in at least one code symbol. In conjunction with the "erasure" mode of said U.S. Pat. No. 4,512,020 the idea of the invention offers a very attractive implementation.

Preferably, a data word reconstruction module has at least two selectively activatable modes of operation each with a different correction capability. The flexibility in dealing with different error causes is thus further enhanced.

Preferably, each row of the matrix [F] contains exactly one "1". In that case many errors of the input/output memory do not become manifest in the relevant memory module of the main memory and the error probability in the latter memory is minimized.

Preferably, each column of the matrix [F] contains exactly one "1". All errors of the input/output memory then become manifest in the relevant memory module of the main memory so that the input/output memory can be readily tested.

The invention also relates to a computer module for use in a multiprocessor computer system of the kind described in which the reducing encoder maps at least one data bit on at least two code bits, the combination formed by the decoder and the reducing encoder mapping each bit from the input/output memory on at the most one bit in the memory module. Using such a computer module, an error-tolerant multiprocessor computer system can be readily formed.

BRIEF DESCRIPTION OF THE FIGURES

The invention will be described in detail hereinafter with reference to some Figures.

FIG. 2 shows an example of a generator matrix of an error correction code for use in a system as shown in FIG. 1.

FIG. 3 shows the separate generator matrices of the reducing encoders, second encoders, and decoders shown in FIG. 2 for a first case;

FIG. 4 shows these separate generator matrices for a second case;

FIGS. 5 and 6 illustrate a further possibility for the matrix [F] and the consequences thereof for the generator matrices.

DESCRIPTION OF THE PREFERRED EMBODIMENT

Figure 1:
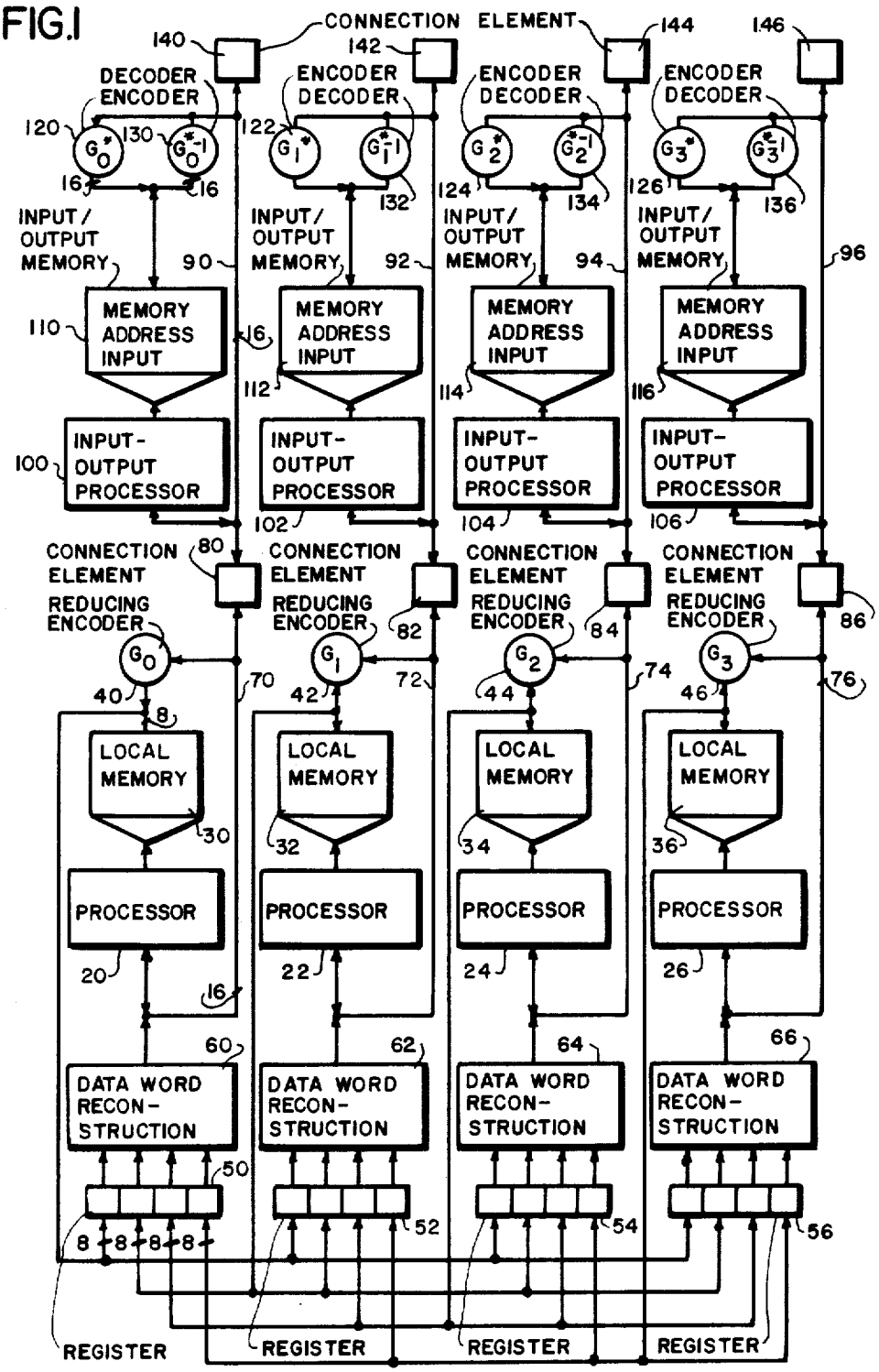
FIG. 1 is a block diagram of a multiprocessor computer system in accordance with the invention.

FIG. 1 is a block diagram of a multiprocessor computer system in accordance with the invention. Part of this Figure corresponds to the diagram of FIG. 3 of the previously U.S. Pat. No. 4,402,045 which is incorporated herein by way of reference. The multiprocessor computer comprises four synchronously controlled computer modules which all execute the same instructions. The synchronization mechanism (not shown) may consist of a system of four mutually synchronized clocks, but has been omitted for the sake of simplicity. The first computer module comprises a processor module 20, for example a suitable microprocessor. The address output thereof is connected to the address input of the local memory 30. The data can be applied to the data input of the local memory module 30 via a data channel 70 and a reducing encoder 40. The sixteen-bit data word is thus converted into an eight-bit code symbol. When the memory 30 is read, the code symbol is applied to a register 50 which has a width of 32 bits. Each sub-computer comprises such a register and all registers are filled with all four 8-bit code symbols. The output of the code word register 50 is connected to the data word reconstruction module 60. This module is capable of correcting an arbitrary incorrect code symbol (arbitrary location and also arbitrary error) so that one of the (four) sub-computers can fail in an arbitrary manner (unless the failure itself adversely affects the operation of the other sub-computers). As has already been stated, in some cases bits in different code symbols can also be corrected (2 bits, each of which is situated in a different code symbol, or 1 code symbol in the erasure mode, which code symbol is then ignored, plus 1 bit in a further code symbol). The above possibilities are applicable to a code based on four-bit symbols; each data and each code word actually consists of two halves, each half thus comprising two and four symbols, respectively. The encoding circuits are simple due to the use of comparatively short symbols. In the extreme left computer module the number of bits transported per word (data word or code word) via the relevant line is indicated. For a different choice of the numbers and lengths of the symbols, corresponding situations occur, provided that each symbol contains at least two bits.

The computer also comprises a data input/output system. Again only the associated part of the input/output system for one computer module will be described. There is provided a connection element 80. This is, for example, a bi-directional tristate buffer which is activated by the processor 20 or an associated control element via control lines (not shown). The connection element may also be completely passive, for example a bus connection; however, all connected elements (data transmitters/receivers) are then selectively activated. A data channel 90 which has a width of 16 bits and which is terminated by a second connection element 140. Also provided is an input/output processor 100, which may be dispensed with in given cases. An address output of the processor 100 is connected to the address input of the memory 110. In the absence of a processor, this memory is, for example, a first-in-first-out (FIFO) buffer which requires no external addressing. Cases in which a processor is required occur, for example, when data is to be formatted for storage in a magnetic disc memory; in addition to the buffer function of the memory 110, also the addition or removal of synchronization information, indication information and void spacing information is then necessary. Such a magnetic disc memory will be connected in one of the ways disclosed in said U.S. Pat. No. 4,512,020. The same is applicable to other input/output situations. In a set-up involving little redundancy, only one of the connection elements 140, 142, 144, 146 is active for transmission, while for receiving all connection elements are active in parallel for all receiving the same information. In a set-up involving a high redundancy, the relevant peripheral apparatus also has a multiple construction (for example, an n-fold construction) and similar reducing encoders are connected, in the same manner as elements 40–46, to the connection elements 140–146 for transmission and, for reception, each of the connection elements 140–146 comprises its own data word reconstruction module which receives all code symbols of the code word. A large variety of possibilities exists between these two extremes.

The different correction facilities previously described relate to different types of failure of the system. When a processor, for example the processor module 20 or the I/O processor module 100, is faulty, such a fault is usually permanent (has a duration amounting to a large number of successive processor cycles) and causes many multibit errors in the code symbol formed (for example by the reducing encoder 40) on the basis of the incorrect data word. There is no remedy against this situation other than the use of the possibilities offered by the symbol correction code in the data word reconstruction module 60. This is because the error in the data word often involves several bits.

The second category of errors is caused by the memory modules. Part of these errors is permanent and involves several bits in a data word (module 140) or in a code symbol (module 30), for example because the address decoder is faulty. Single-bit errors occur much more frequently. These errors often appear as temporary failures. On the one hand such an error may be temporary, for example in that a data bit is disturbed by an alpha radiation particle which induces charge leakage. On the other hand a data bit error may be permanent (for example the bit valve may be continuously zero) but it does not affect other data bits and, because the same address is addressed only at intervals, it also appears as a temporary single bit error. It may also be, for example, when the memory is bit-organized, that one of the integrated circuits outputs only "zeros"; this concerns, for example, a semi-permanent error in the $j^{th}$ bit position of the relevant word/symbol. It is important that such a single bit error, occurring in the memory module 110, does not become manifest as a multibit error upon presentation, via the reducing encoder 40 and possibly after intermediate storage in the memory 30, to the data word reconstruction module 60. In combination with a symbol error in another computer module, such a multibit error would usually be incorrectable. Thus, a single bit error in the module 110 may cause at the most a 1-bit error on the output of the encoder 40. Moreover, the encoder 120 may not introduce further redundancy.

The code is thus defined on symbols comprising 4 bits each, so that only half a data word comprising $2 \times 4 = 8$ bits and one half a code word comprising $4 \times 4 = 16$ bits need be considered. It follows directly therefrom that the generator matrices (Go ... G3) of the reducing encoders 40 ... 46 are always $4 \times 8$ matrices and that the generator matrices $[G_o{}^{*-1} \ldots G_3{}^{*-1}]$ of the relevant decoders 130 ... 136 are always $8 \times 8$ matrices. No information may be modified or lost during the encoding in the second encoders 120-126 and the decoding in the decoders 130-136. It follows therefrom that the generator matrices $[G_o{}^* \ldots G_3{}^*]$ must not be singular and that the product $$[G_0{}^{*-1}] \cdot [G_0{}^*] = [I]$$

is equal to an identity matrix [I] (and similarly in the other modules). We also define:

$$[F] = [G_i] \cdot [G_i{}^{*-1}]$$

so that [F] is the generator matrix for forming the associated code symbol from the content of the memory module (110 ... 116) in accordance with:

$$\vec{a} = [F] \cdot \vec{b}$$

It is known that the matrix [F] is found as follows. When a table is known with all feasible data words (vectors) $\vec{b}$, and each associated code symbol $\vec{a}$, the base vectors $\vec{b}$ which contain only one bit "1" produce the matrix [F]: each column of the matrix [F] is then formed by the code symbol a associated with such a base vector $\vec{b}$. An error in $\vec{b}$ may cause at the most one one-bit error in $\vec{a}$. Therefore, each column of the matrix [F] may contain no more than one "1".

In the system according to the present state of the art, each data word can be reconstructed from the relevant code symbols of an arbitrary choice of k (in the present embodiments: $k = 2$) computer modules. For the generator matrices $[G_o] \ldots [G_n]$ of the reducing encoders, each choice of k rows of the matrix $$[G] = \begin{bmatrix} G_o \\ G_1 \\ \cdot \\ \cdot \\ \cdot \\ G_n \end{bmatrix}$$

results in a square non-singular matrix. Let such a matrix be referred to as:

$$[G_{abc} \ldots] = \begin{bmatrix} G_a \\ G_b \\ G_c \\ \cdot \\ \cdot \end{bmatrix}$$

This matrix consists of $k \times k$ coefficients which are elements of the Galois field $GF(2^b)$— in which b is the length of the symbol expressed in elements of GF(2), (bits). The matrix $[G_{abc} \ldots]$ has an inverse matrix $[G_{abc}{}^{-1} \ldots]$, so that the product $[G_{abc} \ldots] \cdot [G_{abc}{}^{-1} \ldots] = [I]$ is an identity matrix. Evidently, $$[a^* \phi \phi \ldots] \cdot [G_{abc} \ldots] = [G_a],$$

in which $[a^* \phi \phi \ldots]$ consists of k elements of the Galois field $GF(2^b)$, $a^*$ being the unity element and $\phi$ the zero element. It follows therefrom that:

$$[G_a] \cdot [G_{abc}{}^{-1} \ldots] = [a^* \phi \ldots].$$

This may also be written as:

$$[G_a] \cdot [I] \cdot [G_{abc}{}^{-1} \ldots] = [a^* \phi \ldots].$$

Because $[G_i{}^{*-1}] \cdot [G_i{}^*] = [I]$, the following may be written:

$$[G_a] \cdot [G_i{}^{*-1}] \cdot [G_i{}^*] \cdot [G_{abc}{}^{-1} \ldots] = [a^* / \ldots].$$

Let us define $[G_i{}^*] \cdot [G_{abc}{}^{-1} \ldots] = [P]$ and previously we defined:

$$[F] = [G_a] \cdot [G_i{}^{*-1}], \text{ so that } [F] \cdot [P] = [a^* \phi \ldots].$$

Because $[G_1{}^*]$ and $[G_{abc}{}^{-1} \ldots]$ are both non-singular, $[P^{-1}]$ also exists, so that $[P^{-1}] \cdot [P] = [I]$; consequently, $$[F] = [a^* \phi \ldots] \cdot [P^{-1}].$$

Thus far, [P] was considered as a matrix of k×k (in this case k=2) coefficients which formed elements of the Galois GF($2^b$) (in this case b=4). Without any loss of generality, the matrix [P] and the other matrices may be assumed to be binary matrices (in which case the coefficients are formed by bits), because the coefficients of GF($2^b$) are replaced by their companion matrices with coefficients of GF(2):

$$[F] = \begin{bmatrix} 1 0 0 0 0 0 0 0 \\ 0 1 0 0 0 0 0 0 \\ 0 0 1 0 0 0 0 0 \\ 0 0 0 1 0 0 0 0 \end{bmatrix} \cdot [P^{-1}].$$

If the matrix [F] contained a row comprising only coefficients "0", the matrix [$P^{-1}$] would also contain such a row (i.e. one of the first four rows). However, this would mean that the matrix [$P^{-1}$] would be singular, and it has been proved that that is not the case. Therefore, each row of the matrix [F] contains at least a single "1". Some obvious choices for [F] are the following:

$$[F] = [a^*\phi] \quad (1)$$

$$[F] = [\phi a^*] \quad (2)$$

$$[F] = [a^*a^*] \quad (3)$$

Case (1) means that the first half of a data word encoded by the relevant second encoder is copied in the input/output memory on the code symbol to be formed by the reducing encoder of the relevant computer module. Case (2) means that the other half data word is copied on the relevant code symbol in the input/output memory. In these cases a bit error in the copied half is translated into a bit error in the code symbol. A bit error in the non-copied half has no effect on the information in the code symbol. Consequently, the associated processor module cannot perform a periodic test on the non-copied half. Similarly, other configurations can be found for the matrix [F] for other values of the variables n (number of modules, in this case 4), k (number of data symbols in a data word, in this case 2), and b (number of bits in a symbol, in this case 4). It appears from the foregoing that [$G_i$] matrices suffice for the second encoder generator matrix, for which matrices [$G_i^*$] is non-singular, and $$[G_i^{*-1}] \cdot [G_i] = [F],$$

in which [F] is a matrix having coefficients in the Galois field GF(2), with the characteristics that each row contains at least one "1" and each column contains at the most one "1". In this case we use the term "companion matrices" whose elements are selected from the Galois field GF(2), A series of generator matrices for case (1) will now be given by way of example; the derivation of the corresponding matrices for the case (2) is extremely elementary. FIG. 2 shows an example of a generator matrix [G] for the relevant code. This generator matrix has already been given by way of example in the previous U.S. Pat. No. 4,512,020, said Application being incorporated herein by way of reference. FIG. 3 shows the separate generator matrices for the relevant reducing encoders, second encoders and decoders.

It follows from the foregoing that: [$G_i$]·[$G_i^{*-1}$] = [$a^*\phi$]. It follows therefrom that the first row of the matrix [$G_i^*$] must be equal to the first line of the matrix [$G_i$]. The lower (second) line of the matrix [$G_i^*$] must be chosen so that this matrix is non-singular. It has been found that this can already be achieved within the limitation of the code as defined in the last-mentioned Patent Application by the lines [$a^*\phi$] or [$\phi a^*$]. It is to be noted, however, that these are not the only possibilities; however, the above possibilities can be readily implemented. The generator matrices for the decoders follow directly therefrom.

Next said case (3) will be considered. Therein, the code symbol is formed by bit-wise and modulo-2 addition of the content of the first and the second half of the word in the input/output memory. Each bit error in the input/output memory is thus mapped on the associated code symbol. The error frequency induced by the input/output memory is thus doubled ceteris paribus. It is an advantage, however, that the entire input/output memory can now be tested by the processor module 20 ... 26. FIG. 4 shows the generator matrices for the reducing encoders, second encoders and decoders. The following is applicable:

$$[G_i] \cdot [G_i^{*-1}] = [a^*a^*] \text{ or } [G_i] = [a^*a^*] \cdot [G_i^*].$$

In order to save parts, the first row of the matrix [$G_i^*$] can again be chosen from [$\phi a^*$] and [$a^*\phi$]. In the second case:

$$[G_i] = [G_{i1} G_{i0}] = [a^*a^*] \cdot [a_1^*\phi_i].$$

It follows therefrom that $$G_{i1} = a^* + a^i a^i = G_{i1} + a^*$$

$$G_{i0} = a.$$

If $a^i \neq 0$, [$G_i$] is non-singular and there is no problem. On the other hand, if $G_{i0} = \phi$, the value [$\phi a^*$] must be chosen for the upper row of [$G_i^*$].

FIG. 5 illustrates another possibility for the matric [F] for the same values of the variables n, k, b, and the consequences thereof for the generator matrices. For the matrix [F] a configuration is deliberately chosen which not only comprises two submatrices associated with two elements of the Galois field GF($2^4$). The matrix [F], FIG. 5, first line, satisfies the requirements stated above. This associated set of generator matrices [$G_i^*$] is found by way of the associated matrix [$G_i^{*-1}$] as follows:

$$[G_i] \cdot [G_i^{*-1}] = [F].$$

The implementation may be as follows. Because [$G_i$] and [F] are extended from matrices [$G_i'$] and [F'] which are non-singular, surely $$[G_1^{*-1}] = [G_1'^{-1}] \cdot [F'].$$

The [$G_i^{*-1}$] found is usually only one of the feasible solutions. Let us assume: [$G_3'$] = [$a^*\phi$] which matrix has been shown previously. [$G_3'$] and [F'] may then be shaped as shown on the second line in FIG. 5. Because [$G_3'$] = [$G_3'^{-1}$], [$G_3^{*-1}$] = [$G_3'^{-1}$]·[F'], resulting in the same matrix as [F'].

The generator matrix [$G_2$] is determined similarly:

$$[G_2] = [\phi a^*].$$

[G$_2$'] can be found in accordance with FIG. 5, third line, as a permutated identity matrix. [G$_2$'$^{-1}$]=[G$_2$'] and, using the previously determined matrix [F'], [G$_2$*$^{-1}$] can be determined in accordance with FIG. 5, fourth line, Therefrom, [G$_2$*] as shown on the second line of FIG. 5 can be determined.

The matrix G$_1$ is: [a$^7$a$^{11}$].

In accordance with previously stated criteria, i.e. the aim for simplicity, $$[G_1'] = \begin{bmatrix} a^7 & a^{11} \\ a^o & \phi \end{bmatrix}$$

It follows therefrom for the inverse:

$$[G^{-1}] = \begin{bmatrix} \phi & a^o \\ a^4 & a^{11} \end{bmatrix}.$$

For the matrix [F], the previously determined value can be used again, so that the matrix [G$_1$*$^{-1}$] is found in accordance with FIG. 6, first line; this Figure is a continuation of FIG. 5. Finally, the generator matrix [G$_1$*] is calculated as [G$_1$*]=[F'$^{-1}$]·[G'$_1$], in accordance with FIG. 6, second line..

Finally, the matrix [G$_o$]=[a$^{11}$a$^7$]; for the sake of simplicity, $$G_o = \begin{bmatrix} a^{11} & a^7 \\ a^o & \phi \end{bmatrix}, \text{ where } [G_o^{-1}] = \begin{bmatrix} \phi & a^o \\ a^8 & a^4 \end{bmatrix}.$$

The relevant generator matrices are found from [G$_o$*$^{-1}$]=[G$_1$'$^{-1}$]·[F], and [G$_o$*]=[F'$^{-1}$]·[G$_o$'], as shown on the third line and the fourth line, respectively, of FIG. 6.

What is claimed is:

1. A multiprocessor computer system, comprising n synchronously controlled parallel operating computer modules, each of which is localized in its own fault isolation area, each computer module comprising:
 a processor module;
 a data channel which is connected to a data connection of the processor module;
 a reducing encoder which is connected to the data channel in order to form a code symbol from a data word received from said data channel so that said encoders of the modules processing said data word form, on the basis of a data word comprising k data symbols, a code word consisting of k+1≦n<3k code symbols of a code incorporating a simultaneous correction capability in at least two code symbols;
 a memory module comprising a first data input which is connected to a first data output of the associated reducing encoder, and to a relevant second data output of each memory module of the respective computer modules;
 and a data word reconstruction module which is connected via an interconnection network, to the relevant second data outputs of the memory modules of the various computer modules in order to receive a relevant code symbol of a code word from each computer module in order to construct a data word therefrom, the data word reconstruction module comprising a third data output which is connected to said data connection and to said data channel, said data channel also comprising a second data connection for external data input/output, wherein each computer module further comprises:
 a second data channel which is connected in series with said second data connection and which comprises a third data connection;
 an input/output memory module which is connected, at least when a generator matrix (G$_i$) of the associated reducing encoder maps a data bit on more than one code bit to the second data channel, by way of a second nonreducing encoder and a third data input and a decoder which is associated with the second encoder, the following relations existing between the generator matrix (G$_i$) of a reducing encoder, at least in so far as this encoder maps a data bit on more than one code bit, the generator matrix (G$_i$*) of the second encoder, and the generator matrix (G$_i$*$^{-1}$) of the decoder:

[G$_i$*]·[G$_i$*$^{-1}$]=[I], the identity matrix;

[F]=[G$_i$]·[G$_i$*$^{-1}$], in which each column of [F] written as consisting of bits, comprises at the most one "1" and for the remainder exclusively "zeroes", each row of [F] containing at least one "1", so that in the relevant computer module a bit of a data word encoded in the input/output memory is mapped on at the most one bit of the code symbol which can be formed from that data word.

2. A multiprocessor computer system as claimed in claim 1, characterized in that the error correction capability of the code comprises at least one arbitrary error vector in at least one code symbol.

3. A multiprocessor computer system as claimed in claim 1 or 2, wherein a data word reconstruction has at least two modes of operation with different correction capabilities and said system includes means to select a mode.

4. A multiprocessor computer system as claimed in claim 1 or 2, characterized in that each row of the matrix [F] contains exactly one "1".

5. A multiprocessor computer system as claimed in claim 1 or 2, characterized in that each column of the matrix [F] contains exactly one "1".

6. A multiprocessor computer system as claimed in claim 1 or 2, wherein the reducing encoder maps at least one data bit on at least two code bits, the combination formed by the decoder and the reducing encoder mapping each bit from the input/output memory on at the most one bit in the memory module.

* * * * *